(12) United States Patent
Egan et al.

(10) Patent No.: US 10,651,808 B2
(45) Date of Patent: May 12, 2020

(54) COMPOUND SUPERCONDUCTING QUANTUM INTERFERENCE DEVICE OUTPUT AMPLIFIER AND METHODS

(71) Applicant: Microsoft Technology Licensing, LLC, Redmond, WA (US)

(72) Inventors: Jonathan D. Egan, Hanover, MD (US); Quentin P. Herr, Ellicott City, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 69 days.

(21) Appl. No.: 15/990,044

(22) Filed: May 25, 2018

(65) Prior Publication Data

US 2019/0363688 A1 Nov. 28, 2019

(51) Int. Cl.
*H03F 19/00* (2006.01)
*H03F 1/02* (2006.01)
*H03K 19/195* (2006.01)

(52) U.S. Cl.
CPC ............... *H03F 19/00* (2013.01); *H03F 1/02* (2013.01); *H03K 19/195* (2013.01)

(58) Field of Classification Search
CPC ....................................................... H03F 19/00
See application file for complete search history.

(56) References Cited

U.S. PATENT DOCUMENTS

| 5,396,242 | A | * | 3/1995 | Lee | H03M 1/361 |
| | | | | | 341/133 |
| 5,818,373 | A | | 10/1998 | Semenov et al. | |
| 5,963,351 | A | * | 10/1999 | Kaplounenko | H03L 7/24 |
| | | | | | 329/346 |
| 7,724,083 | B2 | | 5/2010 | Herring et al. | |
| 7,786,748 | B1 | | 8/2010 | Herr | |
| 9,097,751 | B1 | | 8/2015 | Longhini et al. | |
| 9,646,682 | B1 | | 5/2017 | Miller et al. | |
| 10,243,582 | B1 | * | 3/2019 | Herr | H03M 5/02 |

(Continued)

OTHER PUBLICATIONS

"Free Software Repository", Retrieved from: http://www.wrcad.com/freestuff.html, Retrieved Date: Feb. 13, 2018, 4 Pages.

(Continued)

*Primary Examiner* — Patricia T Nguyen
(74) *Attorney, Agent, or Firm* — Ranjeev Singh; Singh Law, PLLC

(57) ABSTRACT

Output amplifier comprising a stack of compound superconducting quantum interference device (SQUID) output amplifier stages and related methods are provided. A method includes receiving a first pulse train comprising a first plurality of single flux quantum (SFQ) pulses. The method may further include receiving a second pulse train comprising a second plurality of SFQ pulses, where the second pulse train is delayed by a predetermined fraction of a clock cycle relative to the first pulse train. The method may further include using the stack of the plurality of compound SQUID output amplifier stages converting the first plurality of SFQ pulses and the second plurality of SFQ pulses into a voltage waveform, where each of the plurality of compound SQUID output amplifier stages comprises a pair of superconducting quantum interference devices (SQUIDs).

20 Claims, 5 Drawing Sheets

(56) References Cited

U.S. PATENT DOCUMENTS

| | | | |
|---|---|---|---|
| 2005/0047245 A1* | 3/2005 | Furuta | G11C 7/06 365/222 |
| 2009/0078931 A1* | 3/2009 | Berkley | G06N 10/00 257/31 |
| 2010/0026537 A1* | 2/2010 | Kirichenko | H03M 3/408 341/133 |
| 2010/0033252 A1 | 2/2010 | Herr et al. | |
| 2017/0117901 A1 | 4/2017 | Carmean et al. | |
| 2019/0237648 A1* | 8/2019 | Przybysz | B82Y 10/00 |

OTHER PUBLICATIONS

"Superconducting Technology Assessment", Retrieved from: http://www.nitrd.gov/PUBS/nsa/sta.pdf, Aug. 2005, 257 Pages.

Bhat, et al., "A 10 GHz Digital Amplifier in an Ultra-Small-Spread high-J/sub c/ Nb/Al-AlOx/Nb Integrated circuit Process", In Proceedings of IEEE Transactions on Applied Superconductivity, vol. 9, Issue 2, Jun. 1999, pp. 3232-3235.

Bulzacchelli, et al., "Superconducting Bandpass /spl Delta//spl Sigma/ Modulator with 2.23-GHz center frequency and 42.6-GHz Sampling Rate", In IEEE Journal of Solid-State Circuits, vol. 37, Issue 12, Dec. 2002, pp. 1695-1702.

Hashimoto, et al., "Measurement of Superconductive Voltage Drivers up to 25 Gb/s/ch", In Proceedings of IEEE Transactions on Applied Superconductivity, vol. 19, Issue 3, Jun. 2009, pp. 1022-1025.

Herr, et al., "A Quantum-Accurate Two-Loop Data Converter", In Journal of IEEE Transactions on Applied Superconductivity, vol. 19, Issue 3, Jun. 30, 2009, pp. 676-679.

Herr, et al., "Design of a Ballistic Fluxon Qubit Readout", In Journal of Superconductor Science and Technology, vol. 20, No. 11, Oct. 18, 2007, pp. 450-454.

Herr, et al., "High Speed Data link Between Digital Superconductor Chips", In Journal of Applied Physics Letters, vol. 80, No. 7, Apr. 2002, pp. 3210-3212.

Herr, et al., "Inductive Isolation in Stacked SQUID Amplifiers", In Journal of IEEE Transactions on Applied Superconductivity, vol. 17, Issue 2, Jun. 2007, pp. 565-568.

Herr, "Rapid Communication; A High-Efficiency Superconductor Distributed Amplifier", In Journal of The Superconductor Science and Technology, vol. 23, Issue No. 2, Feb. 1, 2010, 4 Pages.

Herr, Quentin P., "Stacked Double-Flux-Quantum Output Amplifier", In Journal of IEEE Transactions on Applied Superconductivity, vol. 15, Issue 2, Jun. 13, 2005, pp. 259-262.

Inamdar, et al., "Superconducting Switching Amplifiers for High Speed Digital Data Links", In Proceedings of IEEE Transactions on Applied Superconductivity, vol. 19, Issue 3, Jun. 2009, pp. 1026-1033.

Kirichenko, et al., "Advanced on-Chip Test Technology for RSFQ Circuits", In Proceedings of IEEE Transactions on Applied Superconductivity, vol. 7, Issue 2, Jun. 1997, pp. 3438-3441.

Koch, et al., "A NRZ-output Amplifier for RSFQ circuits", In Proceedings of IEEE Transactions on Applied Superconductivity, vol. 9, Issue 2, Jun. 1999, pp. 3549-3552.

Lavoie, et al., "A 10 Gigabit-per-Second Data Collection System for Analog to Digital Converters—", In Journal of IEEE Transactions on Applied Superconductivity, vol. 15, Issue 2, Jun. 13, 2005, pp. 312-315.

"International Search Report and Written Opinion Issued in PCT Application No. PCT/US2019/031924", dated Aug. 6, 2019, 15 Pages.

Przybysz, et al., "Two-loop Modulator for Sigma-Delta Analog to Digital Converter", In Journal of IEEE Transactions on Applied Superconductivity, vol. 5, Issue 2, Jun. 1995, pp. 2248-2251.

Soloviev, et al., "High Voltage Driver for RSFQ Digital Signal Processor", In Proceedings of IEEE Transactions on Applied Superconductivity, vol. 17, Issue 2, Jun. 2007, pp. 470-473.

Herr, et al., "Ultra-Low-Power Superconductor Logic", In Journal of Applied Physics, vol. 109, Issue 10, May 2011, pp. 1-7.

Dubash, et al., "SFQ Data Communication Switch", In Journal of IEEE Transactions on Applied Superconductivity, vol. 7, Issue 2, Jun. 1997, pp. 2681-2684.

Irwin, et al., "SQUID Operational Amplifier", In Journal of IEEE Transactions on Applied Superconductivity, vol. 11, Issue 1, Mar. 2001, pp. 1265-1270.

Mukhanov, et al., "Josephson Output Interfaces for RSFQ Circuits", In Proceedings of IEEE Transactions on applied Superconductivity, vol. 7, Issue 2, Jun. 1997, pp. 2826-2831.

Herr, Quentin P., "A high-efficiency superconductor distributed amplifier", In Journal of Superconductor Science and Technology, vol. 23, Issue 2, Jan. 21, 2010, pp. 1-4.

Mukhanov, et al., "Superconductor Analog-to-Digital Converters", In Proceedings of the IEEE, vol. 92, Issue 10, Oct. 2004, pp. 1564-1584.

* cited by examiner

COMPOUND SUPERCONDUCTING QUANTUM INTERFERENCE DEVICE OUTPUT AMPLIFIER AND METHODS

BACKGROUND

Semiconductor based integrated circuits used in electronic devices include digital circuits based on complimentary metal-oxide semiconductor (CMOS) technology. CMOS technology, however, is reaching its limits in terms of the device size. In addition, leakage current in CMOS based digital circuits is causing high power consumption even when these circuits are not being accessed.

As an example, servers in a data center are increasingly consuming large amounts of power. The consumption of power is partly the result of power loss from the dissipation of energy even when the CMOS circuits are inactive. This is because even when such circuits, such as random-access memories, are inactive and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, such as read/write, power is wasted not only as a result of the requirement to maintain the state of the CMOS transistors, but also as a result of the current leakage.

An alternative approach to CMOS technology-based systems is the use of superconducting logic-based systems.

SUMMARY

In one example, the present disclosure relates to an output amplifier stage including a first terminal for receiving a first pulse train and a second terminal for receiving a second pulse train, where the second pulse train is delayed by a predetermined fraction of a clock cycle relative to the first pulse train. The output amplifier stage may further include a first inductor coupled between the first terminal and a third terminal. The output amplifier stage may further include a first Josephson junction coupled between the first terminal and the third terminal. The output amplifier stage may further include a second inductor coupled between the second terminal and a fourth terminal. The output amplifier stage may further include a second Josephson junction coupled between the second terminal and the fourth terminal. The output amplifier stage may further include a compound superconducting quantum interference device (SQUID) configured to convert the first pulse train and the second pulse train into a non-return-to-zero (NRZ) voltage waveform.

In another aspect, a method in an output amplifier comprising a stack of a plurality of compound superconducting quantum interference device (SQUID) output amplifier stages connected in series is provided. The method may include receiving a first pulse train comprising a first plurality of single flux quantum (SFQ) pulses. The method may further include receiving a second pulse train comprising a second plurality of SFQ pulses, where the second pulse train is delayed by a predetermined fraction of a clock cycle relative to the first pulse train. The method may further include using the stack of the plurality of compound SQUID output amplifier stages converting the first plurality of SFQ pulses and the second plurality of SFQ pulses into a voltage waveform, where each of the plurality of compound SQUID output amplifier stages comprises a pair of superconducting quantum interference devices (SQUIDs).

In yet another aspect, the present disclosure relates to an output amplifier including a first terminal for receiving a first pulse train comprising a first plurality of single flux quantum (SFQ) pulses. The output amplifier may further include a delay element coupled between the first terminal and a second terminal, where the delay element is configured to delay the first pulse train by a predetermined fraction of a clock cycle and provide a second pulse train comprising a second plurality of SFQ pulses. The output amplifier may further include a stack of a plurality of compound SQUID output amplifier stages configured to receive the first plurality of SFQ pulses and the second plurality of SFQ pulses and convert the first plurality of SFQ pulses and the second plurality of SFQ pulses into a voltage waveform, where each of the plurality of compound SQUID output amplifier stages comprises a pair of superconducting quantum interference devices (SQUIDs).

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
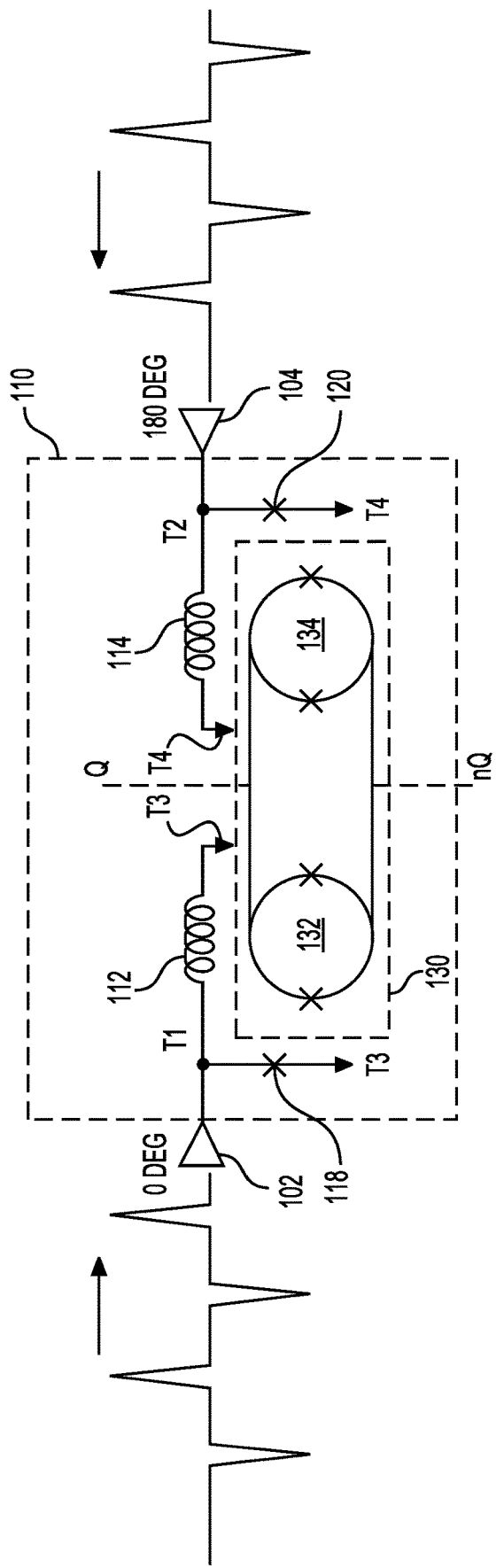
FIG. 1 shows a diagram of a compound superconducting quantum interference device (SQUID) non-return to zero (NRZ) output amplifier in accordance with one example.

Examples described in this disclosure relate to superconducting logic-based output amplifier systems. Certain examples relate to compound superconducting quantum interference device (SQUID) output amplifiers. Certain other examples relate to compound SQUID non-return-to-zero (NRZ) output amplifier systems. A compound SQUID NRZ output amplifier may be implemented using any single flux quantum (SFQ) compatible logic. One example of such logic is quantum flux parametron (QFP). Another example of such logic is the reciprocal quantum logic (RQL). Thus, certain examples further relate to reciprocal quantum logic (RQL) compatible output amplifiers. Unlike CMOS transistors, the RQL circuits are superconductor circuits that use Josephson junction-based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance. As an example, at temperatures below Tc (e.g., 9.3 K), niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate, and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B, goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

For RQL using RZ data encoding, a logical "1" may be encoded as a positive SFQ pulse followed by a negative SFQ pulse occurring half a period later, and a logical "0" may be encoded as no pulses. Alternately, for RQL operating in "phase mode", the negative SFQ pulse may be delayed for an arbitrary number of clock cycles, but it will still be separated from the positive pulse by an odd number of half-clock cycles. Standard CMOS devices want to see an NRZ voltage square waveform, which is more bandwidth efficient.

Certain examples in this disclosure relate to an output amplifier that converts single flux quantum (SFQ) pulses into a voltage waveform. The voltage waveform can be measured in a non-cryogenic environment (e.g., in an environment having a temperature above 77 Kelvin). In one example, the voltage waveform is square waveform. One example of the output amplifier converts RQL logic compatible SFQ pulses into non-return-to-zero (NRZ) voltage waveforms. In one example, the output amplifier is a compound superconducting quantum interference device (SQUID) output amplifier that uses a pair of SQUIDs at every stage of the amplifier. The output amplifier is a differential amplifier and it may advantageously use a minimum of circuitry to provide NRZ voltage waveforms that can be measured in a non-cryogenic environment.

FIG. 1 shows a diagram of a compound superconducting quantum interference device (SQUID) non-return to zero (NRZ) output amplifier stage 110 in accordance with one example. In this example, compound SQUID NRZ output amplifier stage 110 may receive a first pulse train comprising single flux quantum (SFQ) pulses at terminal T1 via a Josephson transmission line (JTL) element 102. Compound SQUID NRZ output amplifier stage 110 may receive a second pulse train comprising SFQ pulses at terminal T2 via another JTL element 104. The second pulse train may be delayed relative to the first pulse train by half a clock cycle. With respect to reciprocal quantum logic (RQL) compatible SFQ pulses, this may correspond to a 180 degrees phase difference between the two pulse trains. In one example, a Resonator Clock source may provide a sinusoidal or an alternating current (AC) clock that may both clock and provide power to compound SQUID NRZ output amplifier stage 110. Two clocks that are 90 degrees out of phase may be used. Alternatively, a four-phase clock may be used. The four-phase clock may be derived by coupling the clock lines to the Josephson junctions in the gates of a respective superconducting circuit in a wound or counter-wound fashion. The four phases of the clock may provide directionality to the single flux quantum (SFQ) pulses. Thus, as an example, with respect to a four-phase clock, the positive pulse may ride the leading edge of the clock from one phase to the next and arrive at the output after one cycle of delay and the negative pulse may follow with half a cycle of separation.

With continued reference to FIG. 1, Compound SQUID NRZ output amplifier stage 110 may include an inductor 112 coupled between terminal T1 and terminal T3, which may be a ground terminal. Compound SQUID NRZ output amplifier stage 110 may include a Josephson junction (JJ) 118 coupled between terminal T1 and terminal T3. Compound SQUID NRZ output amplifier stage 110 may further include another inductor 114 coupled between terminal T2 and terminal T4, which may also be a ground terminal. Compound SQUID NRZ output amplifier stage 110 may include a Josephson junction (JJ) 120 coupled between terminal T2 and terminal T4. Compound SQUID NRZ output amplifier stage 110 may further include a compound SQUID 130 including a pair of SQUIDs (e.g., SQUID 132 and SQUID 134) that may be arranged in parallel. Although FIG. 1 shows a certain number of components of Compound SQUID NRZ output amplifier stage 110 arranged in a certain manner, there could be more or fewer number of components arranged differently.

Figure 2:
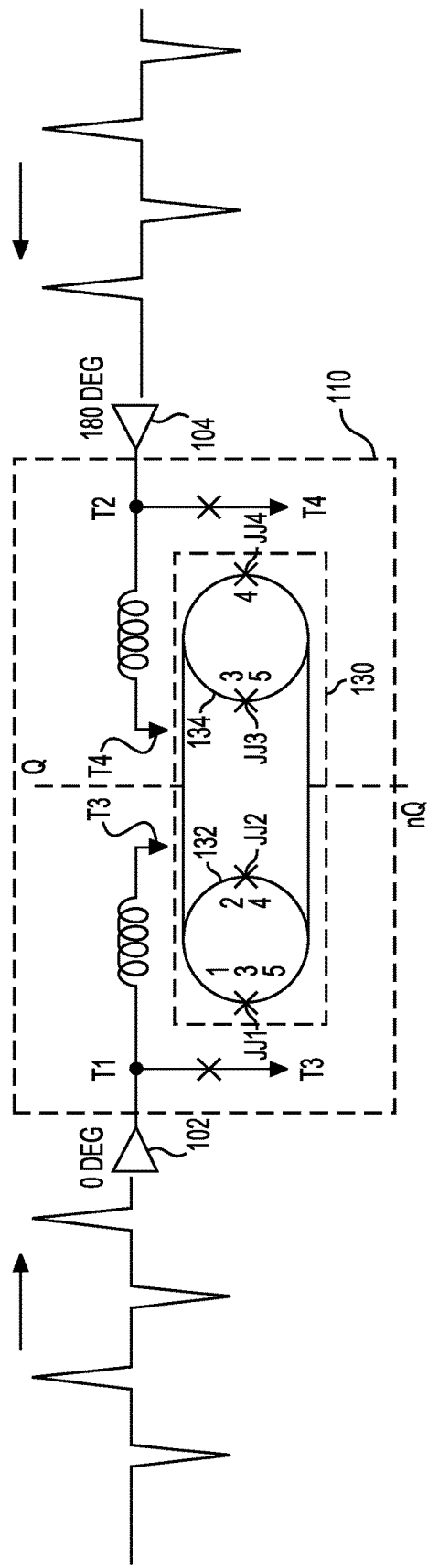
FIG. 2 shows a diagram showing the operation of the compound SQUID NRZ output amplifier of FIG. 1 in accordance with one example.

FIG. 2 shows a diagram showing the operation of the compound SQUID NRZ output amplifier 110 of FIG. 1 in accordance with one example. In this example, when Josephson Junction (JJ1) in SQUID 132 triggers (item 1) it creates an SFQ pulse which triggers JJ2 in SQUID 132 (item 2). When JJ2 in SQUID 132 triggers, it triggers JJ1 in SQUID 132 (item 3) and at the same time it triggers JJ3 in SQUID 134 (item 3). Then both Josephson junctions JJ1 and JJ3 (in response to item 3) trigger Josephson junctions JJ2 in SQUID 132 and JJ4 in SQUID 134 (item 5), and then it repeats. This results in an oscillation of the two SQUIDs (SQUID 132 and SQUID 134) creating a voltage waveform as an output. In sum, compound SQUID 130 effectively does a logical OR on the input stimuli, thereby converting return-to-zero signals on the inputs to non-return-to-zero signals on the output, due to the relative delay.

Figure 3:
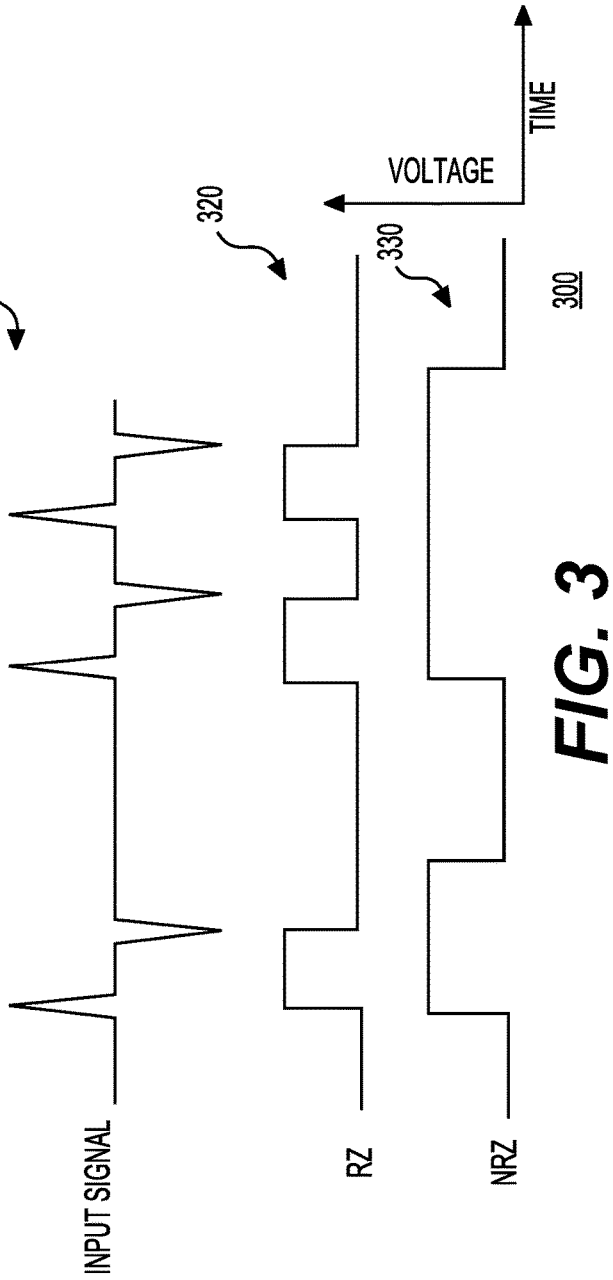
FIG. 3 shows a timing diagram corresponding to the operation of the compound SQUID NRZ output amplifier of FIG. 1 in accordance with one example.

FIG. 3 shows a waveform diagram 300 illustrating the operation of compound SQUID NRZ output amplifier stage 110 of FIG. 1 in accordance with one example. As shown in FIG. 3, in response to input SFQ pulse trains 310, unlike conventional output amplifiers that convert input signals into return-to-zero (RZ) voltage waveforms 320, compound SQUID NRZ output amplifier stage 110 converts the input SFQ pulse trains into non-return-to-zero (NRZ) voltage waveforms 330.

Figure 4:
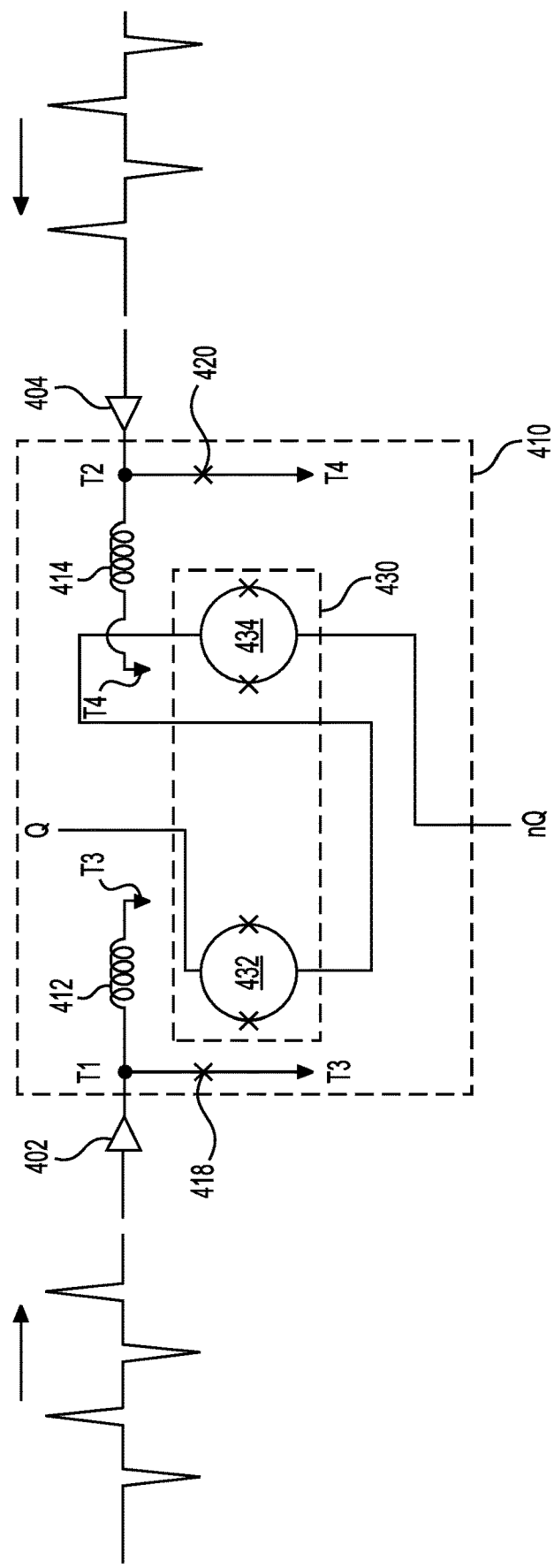
FIG. 4 shows a diagram of another compound SQUID NRZ output amplifier in accordance with one example.

FIG. 4 shows a diagram of another compound SQUID NRZ output amplifier stage 410 in accordance with one example. In this example, compound SQUID NRZ output amplifier stage 410 may receive a first pulse train comprising single flux quantum (SFQ) pulses at terminal T1 via a Josephson transmission line (JTL) element 402. Compound SQUID NRZ output amplifier stage 410 may receive a second pulse train comprising SFQ pulses at terminal T2 via another JTL element 404. The second pulse train may be delayed relative to the first pulse train by half a clock cycle. With respect to reciprocal quantum logic (RQL) compatible SFQ pulses, this may correspond to a 180 degrees phase difference between the two pulse trains. Compound SQUID NRZ output amplifier stage 410 may include an inductor 412 coupled between terminal T1 and terminal T3, which may be a ground terminal. Compound SQUID NRZ output amplifier stage 410 may include a Josephson junction (JJ) 418 coupled between terminal T1 and terminal T3. Compound SQUID NRZ output amplifier stage 410 may further include another inductor 414 coupled between terminal T2 and terminal T4, which may also be a ground terminal. Compound SQUID NRZ output amplifier stage 410 may include a Josephson junction (JJ) 420 coupled between terminal T2 and terminal T4. Compound SQUID NRZ output amplifier stage 410 may further include a compound SQUID 430 including a pair of SQUIDs (e.g., SQUID 432 and SQUID 434) that may be arranged in series. Although FIG. 4 shows a certain number of components of Compound SQUID NRZ output amplifier stage 410 arranged in a certain manner, there could be more or fewer number of components arranged differently.

Figure 5:
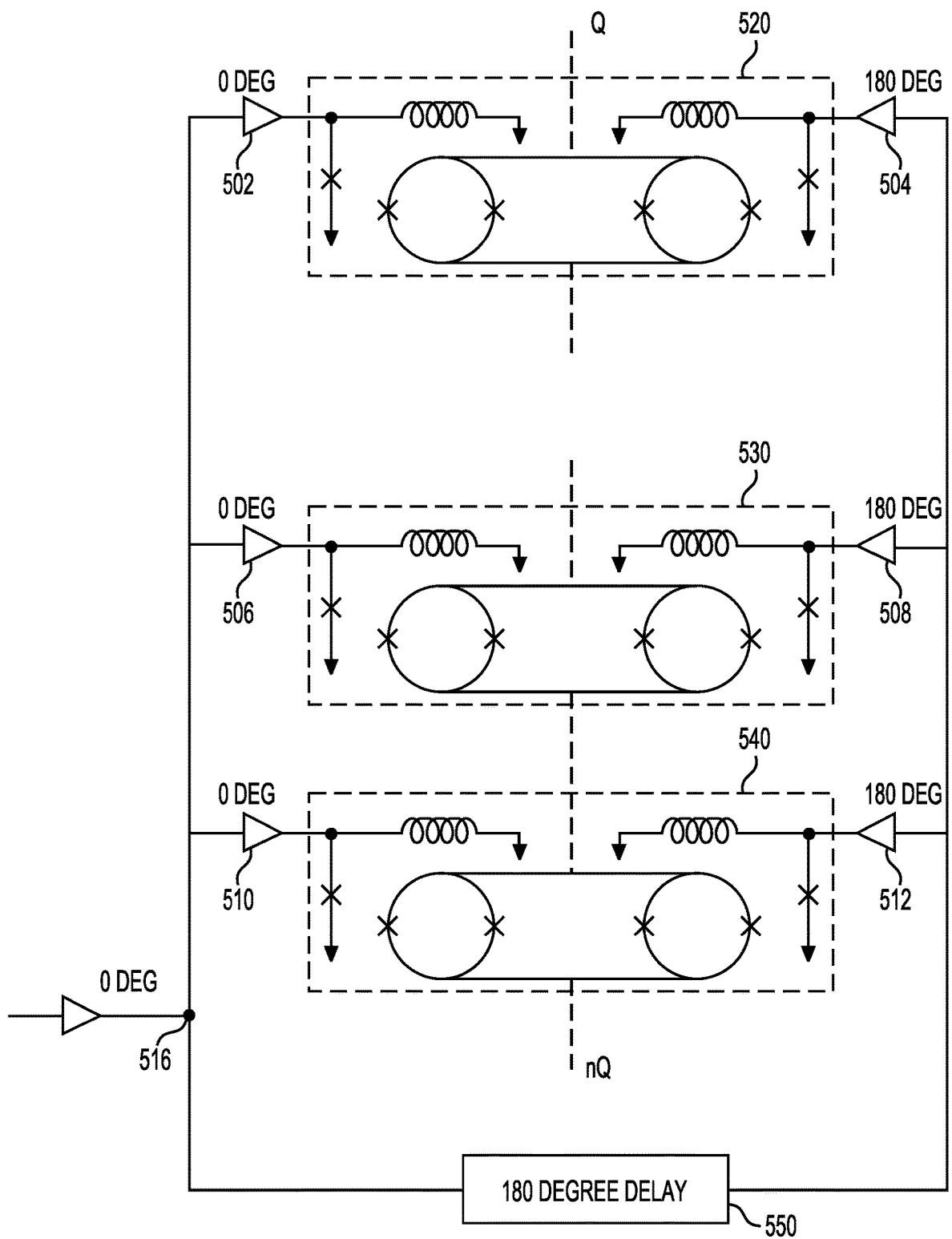
FIG. 5 shows a compound SQUID NRZ output amplifier in accordance with one example.

FIG. 5 shows a compound SQUID NRZ output amplifier 500 in accordance with one example. Compound SQUID NRZ output amplifier 500 may include a stack of compound SQUID NRZ output amplifier stages 520, 530, and 540 connected in series. An input SFQ pulse train may be coupled to each of compound SQUID NRZ output amplifier stages 520, 530, and 540 as a 0-degree delay input pulse train via node 516 in the manner shown in FIG. 5. Thus, the input SFQ pulse train may be coupled to compound SQUID NRZ output amplifier stage 520 via a Josephson transmission line (JTL) element 502. The input SFQ pulse train may be coupled to compound SQUID NRZ output amplifier stage 530 via a Josephson transmission line (JTL) element 506. The input SFQ pulse train may be coupled to compound SQUID NRZ output amplifier stage 540 via a Josephson transmission line (JTL) element 510.

With continued reference to FIG. 5, the input SFQ pulse train may be delayed by a 180 degree delay 550 and coupled to each of compound SQUID NRZ output amplifier stages 520, 530, and 540 as a 180 degree delay input pulse train in the manner shown in FIG. 5. Thus, the 180-degree delayed inputs SFQ pulse train may be coupled to compound SQUID NRZ output amplifier stage 520 via a Josephson transmission line (JTL) element 504. The 180-degree delayed inputs SFQ pulse train may be coupled to compound SQUID NRZ output amplifier stage 530 via a Josephson transmission line (JTL) element 508. The 180-degree delayed inputs SFQ pulse train may be coupled to compound SQUID NRZ output amplifier stage 540 via a Josephson transmission line (JTL) element 512. As described earlier, with respect to FIGS. 1 and 2, each compound SQUID NRZ output amplifier stage may generate a voltage output. The stack of compound SQUID NRZ output amplifier stages 520, 530, and 540 may sum up the voltage produced by each stage. Although FIG. 5 shows a certain number of components of compound SQUID NRZ output amplifier 500 arranged in a certain manner, there may be additional or fewer components arranged differently. As an example, although FIG. 5 shows the pair of SQUIDs arranged in parallel to each other, they may be arranged in series as shown in FIG. 4.

Figure 6:
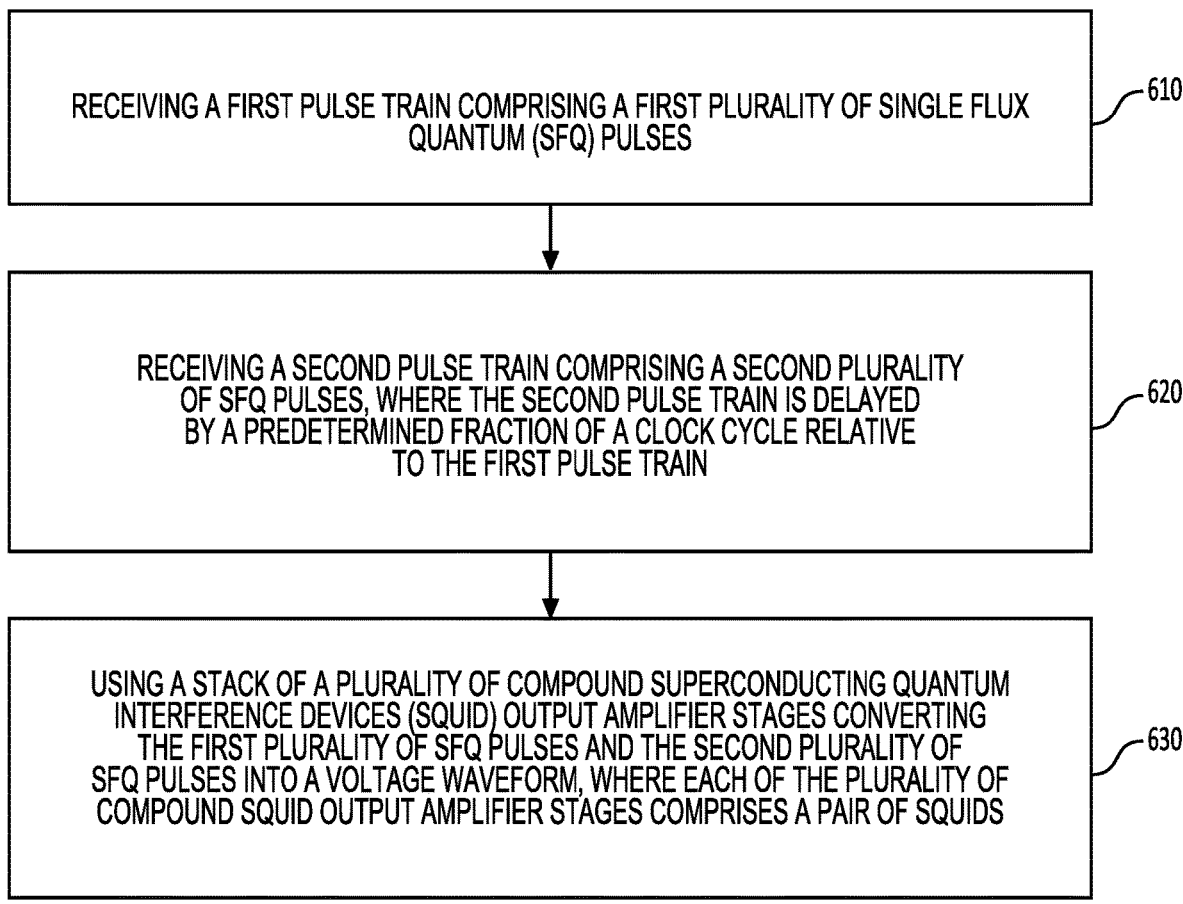
FIG. 6 shows a flow diagram for a method related to a memory system in accordance with one example.

In accordance with one example, FIG. 6 shows a flow chart corresponding to a method associated with a compound SQUID NRZ output amplifier system. In this example, the method may be performed by the output amplifier described with respect to FIG. 5. Step 610 may include the output amplifier receiving a first pulse train comprising a first plurality of single flux quantum (SFQ) pulses.

Step 620 may include receiving a second pulse train comprising a second plurality of SFQ pulses, where the second pulse train is delayed by a predetermined fraction of a clock cycle relative to the first pulse train. As explained earlier with respect to FIG. 5, in one example, the second pulse train may be delayed using a delay element that may be used to introduce 180 degrees phase delay. Thus, in an implementation where output amplifier clock is a resonator clock with at least two phases, a Josephson transmission line (JTL) element may be configured to introduce a 180 degrees delay.

Step 630 may include using the stack of the plurality of compound SQUID output amplifier stages converting the first plurality of SFQ pulses and the second plurality of SFQ pulses into a voltage waveform, where each of the plurality of compound SQUID output amplifier stages comprises a pair of superconducting quantum interference devices (SQUIDs). In this example, each of the compound SQUID output amplifier stages may be implemented in a similar fashion as shown in FIGS. 1-4.

In conclusion, in one example, the present disclosure relates to an output amplifier stage including a first terminal for receiving a first pulse train and a second terminal for receiving a second pulse train, where the second pulse train is delayed by a predetermined fraction of a clock cycle relative to the first pulse train. The output amplifier stage may further include a first inductor coupled between the first terminal and a third terminal. The output amplifier stage may further include a first Josephson junction coupled between the first terminal and the third terminal. The output amplifier stage may further include a second inductor coupled between the second terminal and a fourth terminal. The output amplifier stage may further include a second Josephson junction coupled between the second terminal and the fourth terminal. The output amplifier stage may further include a compound superconducting quantum interference device (SQUID) configured to convert the first pulse train and the second pulse train into a non-return-to-zero (NRZ) voltage waveform.

In the output amplifier stage, each of the third terminal and the fourth terminal may be a ground terminal. In addition, the compound SQUID may comprise a pair of SQUIDs arranged in parallel to each other. Alternatively, the compound SQUID may comprise a first SQUID connected in series to a second SQUID.

Each of the first pulse train and the second pulse train may comprise reciprocal quantum logic compatible signals. Each of the first pulse train and the second pulse train may comprise single flux quantum pulses. The NRZ voltage waveform may comprise an NRZ voltage square-waveform.

The predetermined fraction of the clock cycle may comprise 0.5. In addition, the second pulse train may be delayed by the predetermined fraction of the clock cycle relative to the first pulse train based on Josephson transmission line elements configured to delay a first phase of the second pulse train relative to a second phase of the first pulse train by 180 degrees.

In another aspect, a method in an output amplifier comprising a stack of a plurality of compound superconducting quantum interference device (SQUID) output amplifier stages connected in series is provided. The method may include receiving a first pulse train comprising a first plurality of single flux quantum (SFQ) pulses. The method may further include receiving a second pulse train comprising a second plurality of SFQ pulses, where the second pulse train is delayed by a predetermined fraction of a clock cycle relative to the first pulse train. The method may further include using the stack of the plurality of compound SQUID output amplifier stages converting the first plurality of SFQ pulses and the second plurality of SFQ pulses into a voltage waveform, where each of the plurality of compound SQUID output amplifier stages comprises a pair of superconducting quantum interference devices (SQUIDs).

Each of the pairs of SQUIDs may be arranged in parallel to each other. Alternatively, each of the pairs of SQUIDs may be arranged in series. The voltage waveform may comprise a non-return-to-zero (NRZ) voltage square-waveform. The predetermined fraction of the clock cycle may comprise 0.5.

In yet another aspect, the present disclosure relates to an output amplifier including a first terminal for receiving a first pulse train comprising a first plurality of single flux quantum (SFQ) pulses. The output amplifier may further include a delay element coupled between the first terminal and a second terminal, where the delay element is configured to delay the first pulse train by a predetermined fraction of a clock cycle and provide a second pulse train comprising a second plurality of SFQ pulses. The output amplifier may further include a stack of a plurality of compound SQUID output amplifier stages configured to receive the first plurality of SFQ pulses and the second plurality of SFQ pulses and convert the first plurality of SFQ pulses and the second plurality of SFQ pulses into a voltage waveform, where each of the plurality of compound SQUID output amplifier stages comprises a pair of superconducting quantum interference devices (SQUIDs).

Each of the pairs of SQUIDs may be arranged in parallel to each other. Alternatively, each of the pairs of SQUIDs may be arranged in series. The voltage waveform may comprise a non-return-to-zero (NRZ) voltage square-waveform. The predetermined fraction of the clock cycle may comprise 0.5. In addition, the delay element may comprise at least one Josephson transmission line (JTL) element configured to introduce a 180 degrees phase difference between the first plurality of SFQ pulses and the second plurality of SFQ pulses.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 710, to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. An output amplifier stage comprising:
a first terminal for receiving a first pulse train;
a second terminal for receiving a second pulse train, wherein the second pulse train is delayed by a predetermined fraction of a clock cycle relative to the first pulse train;
a first inductor coupled between the first terminal and a third terminal;
a first Josephson junction coupled between the first terminal and the third terminal;
a second inductor coupled between the second terminal and a fourth terminal;
a second Josephson junction coupled between the second terminal and the fourth terminal, wherein each of the third terminal and the fourth terminal is a around terminal; and
a compound superconducting quantum interference device (SQUID) configured to convert the first pulse train and the second pulse train into a non-return-to-zero (NRZ) voltage waveform.

2. The output amplifier stage of claim 1, wherein the compound SQUID comprises a pair of SQUIDs arranged in parallel to each other.

3. The output amplifier stage of claim 1, wherein each of the compound SQUID comprises a first SQUID connected in series to a second SQUID.

4. The output amplifier stage of claim 1, wherein each of the first pulse train and the second pulse train comprises reciprocal quantum logic compatible signals.

5. The output amplifier stage of claim 1, wherein each of the first pulse train and the second pulse train comprises single flux quantum pulses.

6. The output amplifier stage of claim 1, wherein the predetermined fraction of the clock cycle comprises 0.5.

7. The output amplifier stage of claim 1, wherein the NRZ voltage waveform comprises an NRZ voltage square-waveform.

8. The output amplifier stage of claim 1, wherein the second pulse train is delayed by the predetermined fraction of the clock cycle relative to the first pulse train based on Josephson transmission line elements configured to delay a first phase of the second pulse train relative to a second phase of the first pulse train by 180 degrees.

9. A method in an output amplifier comprising a stack of a plurality of compound superconducting quantum interference device (SQUID) output amplifier stages connected in series, the method comprising:
receiving a first pulse train comprising a first plurality of single flux quantum (SFQ) pulses;
receiving a second pulse train comprising a second plurality of SFQ pulses, wherein the second pulse train is delayed by a predetermined fraction of a clock cycle relative to the first pulse train; and
using the stack of the plurality of compound SQUID output amplifier stages converting the first plurality of SFQ pulses and the second plurality of SFQ pulses into a voltage waveform, wherein each of the plurality of compound SQUID output amplifier stages comprises a pair of superconducting quantum interference devices (SQUIDs), wherein each of the pairs of SQUIDs is arranged in series.

10. The method of claim 9, wherein the predetermined fraction of the clock cycle comprises 0.5.

11. The method of claim 9, wherein the voltage waveform comprises a non-return-to-zero (NRZ) voltage square-waveform.

12. An output amplifier comprising:
a first terminal for receiving a first pulse train comprising a first plurality of single flux quantum (SFQ) pulses;
a delay element coupled between the first terminal and a second terminal, wherein the delay element is configured to delay the first pulse train by a predetermined fraction of a clock cycle and provide a second pulse train comprising a second plurality of SFQ pulses;
a stack of a plurality of compound SQUID output amplifier stages configured to receive the first plurality of SFQ pulses and the second plurality of SFQ pulses and convert the first plurality of SFQ pulses and the second plurality of SFQ pulses into a voltage waveform, wherein each of the plurality of compound SQUID output amplifier stages comprises a pair of superconducting quantum interference devices (SQUIDs), wherein each of the pairs of SQUIDs is arranged in series.

13. The output amplifier of claim 12, wherein the predetermined fraction of the clock cycle comprises 0.5.

14. The output amplifier of claim 12, wherein the voltage waveform comprises a non-return-to-zero (NRZ) voltage square-waveform.

15. The output amplifier of claim 12, wherein the delay element comprises at least one Josephson transmission line (JTL) element configured to introduce a 180 degrees phase difference between the first plurality of SFQ pulses and the second plurality of SFQ pulses.

16. The output amplifier stage of claim 1, wherein the compound SQUID is powered using an alternating current (AC) clock signal.

17. The method of claim 9, wherein each of the pairs of SQUIDs is powered using an alternating current (AC) clock signal.

18. The method of claim 9, wherein each of first plurality of SFQ pulses and the second plurality of SFQ pulses comprises positive SFQ pulses and negative SFQ pulses.

19. The output amplifier of claim 12, wherein each of the pairs of SQUIDs is powered using an alternating current (AC) clock signal.

20. The output amplifier of claim 12, wherein each of first plurality of SFQ pulses and the second plurality of SFQ pulses comprises positive SFQ pulses and negative SFQ pulses.

* * * * *